(12) United States Patent
Lee et al.

(10) Patent No.: US 9,799,827 B2
(45) Date of Patent: Oct. 24, 2017

(54) METHOD OF MANUFACTURING AN ELECTRONIC DEVICE INCLUDING A SEMICONDUCTOR MEMORY HAVING A METAL ELECTRODE AND A METAL COMPOUND LAYER SURROUNDING SIDEWALL OF THE METAL ELECTRODE

(71) Applicant: SK hynix Inc., Icheon-Si (KR)

(72) Inventors: Min-Suk Lee, Icheon-Si (KR); Chang-Hyup Shin, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/880,108

(22) Filed: Oct. 9, 2015

(65) Prior Publication Data

US 2016/0035972 A1 Feb. 4, 2016

Related U.S. Application Data

(63) Continuation of application No. 14/274,708, filed on May 10, 2014, now Pat. No. 9,159,912.

(30) Foreign Application Priority Data

Jul. 25, 2013 (KR) ........................ 10-2013-0088117

(51) Int. Cl.
*H01L 43/12* (2006.01)
*G11C 13/00* (2006.01)
(Continued)

(52) U.S. Cl.
CPC .......... *H01L 43/12* (2013.01); *G11C 13/0004* (2013.01); *H01L 43/02* (2013.01);
(Continued)

(58) Field of Classification Search
CPC ......... H01L 43/12; H01L 43/02; H01L 43/08; H01L 45/085; H01L 45/1233;
(Continued)

(56) References Cited

U.S. PATENT DOCUMENTS

| 8,120,126 B2 | 2/2012 | Lee et al. |
| 2006/0186491 A1* | 8/2006 | Park ................. H01L 21/28061 |
| | | 257/412 |

(Continued)

FOREIGN PATENT DOCUMENTS

| KR | 1020050001104 A | 6/2005 |
| KR | 101073132 B1 | 6/2011 |

*Primary Examiner* — Dung Le
(74) *Attorney, Agent, or Firm* — Perkins Coie LLP

(57) ABSTRACT

A method of manufacturing an electronic device including a semiconductor memory is provided. The method may include forming a material layer for forming a variable resistance element over a substrate, forming a metal layer over the material layer, forming a mask pattern over the metal layer, forming a metal layer pattern by etching the metal layer using the mask pattern as an etch barrier, performing a surface treatment on the metal layer pattern, and etching the material layer using the metal layer pattern and the metal compound layer as an etch barrier to form a variable resistance element having an external side aligned with an external side of the metal compound layer. An external part of the metal layer pattern may be transformed into a metal compound layer. The metal compound layer may have a low etch rate as an etch barrier.

23 Claims, 10 Drawing Sheets

(51) Int. Cl.
  *H01L 43/08*    (2006.01)
  *H01L 45/00*    (2006.01)
  *H01L 43/02*    (2006.01)
  *G11C 27/00*    (2006.01)

(52) U.S. Cl.
  CPC .............. *H01L 43/08* (2013.01); *H01L 45/04* (2013.01); *H01L 45/06* (2013.01); *H01L 45/08* (2013.01); *H01L 45/085* (2013.01); *H01L 45/1233* (2013.01); *H01L 45/1253* (2013.01); *H01L 45/141* (2013.01); *H01L 45/146* (2013.01); *H01L 45/147* (2013.01); *H01L 45/1675* (2013.01); *G11C 27/00* (2013.01); *G11C 2213/52* (2013.01)

(58) Field of Classification Search
  CPC ... H01L 45/1253; H01L 45/146; H01L 45/06; H01L 45/1675
  See application file for complete search history.

(56)    References Cited

U.S. PATENT DOCUMENTS

| | | |
|---|---|---|
| 2008/0026586 A1 | 1/2008 | Cho et al. |
| 2009/0016100 A1 | 1/2009 | Jeong |
| 2013/0248355 A1* | 9/2013 | Ohsawa .................. H01L 43/12 204/192.34 |
| 2013/0336042 A1 | 12/2013 | Lee et al. |

* cited by examiner

METHOD OF MANUFACTURING AN ELECTRONIC DEVICE INCLUDING A SEMICONDUCTOR MEMORY HAVING A METAL ELECTRODE AND A METAL COMPOUND LAYER SURROUNDING SIDEWALL OF THE METAL ELECTRODE

CROSS-REFERENCE TO RELATED APPLICATION

The present application is a continuation of, and claims priority and benefits of, U.S. patent application Ser. No. 14/274,708, published as US 2015/0029779, entitled "ELECTRONIC DEVICE AND METHOD FOR FABRICATING THE SAME," and filed on May 10, 2014, which further claims priority of Korean Patent Application No. 10-2013-0088117, entitled "ELECTRONIC DEVICE AND METHOD FOR FABRICATING THE SAME," and filed on Jul. 25, 2013. The contents of the before-mentioned patent applications (including US 2015/0029779) are incorporated herein by reference in their entirety as part of the disclosure of this document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device facilitates the patterning of a variable resistance element and can secure device characteristics and a method of fabricating the same.

In one aspect, an electronic device includes semiconductor memory, and the semiconductor memory includes a lower electrode, a variable resistance element over the lower electrode, an upper electrode over the variable resistance element and including a metal, and a metal compound layer configured to surround a side of the upper electrode. The metal compound layer includes a compound of the metal of the upper electrode.

In another aspect, an electronic device is provided to include semiconductor memory which includes a lower electrode, a variable resistance element over the lower electrode, an upper electrode over the variable resistance element and including a metal, and a metal compound layer formed over the variable resistance element and configured to surround a side of the upper electrode, wherein the metal compound layer includes a compound of the metal of the upper electrode. In another aspect, an electronic device is provided to include semiconductor memory which includes a lower electrode; a magnetic resistance element formed over the lower electrode; an upper electrode formed of a metal over the magnetic resistance element; and a metal compound layer exhibiting a low etch rate and surrounding the upper electrode, the metal compound layer located above the magnetic resistance element to have an external side surface aligned with an external side of the magnetic resistance element. In some implementations, the variable resistance element includes a sequentially stacked structure including a first magnetic layer, a tunnel barrier layer, and a second magnetic layer. In some implementations, the variable resistance element includes a metal oxide. In some implementations, the variable resistance element includes a phase change material. In some implementations, a side of the metal compound layer is aligned with a side of the variable resistance element. In some implementations, the upper electrode has a smaller width than the variable resistance element. In some implementations, the metal compound layer is a metal oxide layer or a metal nitride layer. The metal compound layer is a metal nitride layer. In some implementations, the compound of the metal of the upper electrode has a low etch rate in an etching process having strong physical etching characteristics. In some implementations, the metal compound layer has a low etch rate lower than etch rates of materials in the magnetic resistance element. In some implementations, the metal compound layer is a metal oxide. In some implementations, the metal compound layer is a metal nitride.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method of manufacturing an electronic device comprising semiconductor memory is provided. In some implementations, the method may include: forming a material layer for forming a variable resistance element over a substrate; forming a metal layer over the material layer; forming a mask pattern over the metal layer; forming a metal layer pattern by etching the metal layer using the mask pattern as an etch barrier; transforming a part of the metal layer pattern, corresponding to a specific width from a side of the metal layer pattern, into a metal compound layer by performing surface treatment on the metal layer pattern; and forming a variable resistance element by etching the material layer using the metal layer pattern and the metal compound layer as an etch barrier. In some implementations, the method may include: forming a material layer for forming a variable resistance element over a substrate; forming a metal layer over the material layer; forming a mask pattern over the metal layer; forming a metal layer pattern by etching the metal layer using the mask pattern as an etch barrier; transforming an external part of the metal layer pattern, corresponding to a specific width from an external side of the metal layer pattern, into a metal compound layer by performing surface treatment on the metal layer pattern to have a low etch rate as an etch barrier; and etching the material layer using the metal layer pattern and the metal compound layer as an etch barrier to form a variable resistance element having an external side aligned with an external side of the metal compound layer.

In some implementations, the forming of the material layer includes forming a sequentially stack structure including a first magnetic layer, a tunnel barrier layer, and a second magnetic layer. In some implementations, the forming of the material layer comprises forming a metal oxide layer. In some implementations, the forming of the material layer comprises forming a phase change material layer. In some implementations, the surface treatment is performed using plasma treatment or thermal treatment. In some implementations, the surface treatment is performed to cause oxidation of the material layer, and the metal compound layer includes a metal oxide layer. In some implementations, the surface treatment is performed in an atmosphere including nitrogen, and the metal compound layer includes a metal nitride layer. In some implementations, the forming of the variable resistance element is performed using a sputtering etching method. In some implementations, the forming of the variable resistance element is performed using an ion beam etching method. In some implementations, the surface treatment is performed in an atmosphere including oxygen, and the metal compound layer includes a metal oxide layer.

In some implementations, the forming of the mask pattern includes: forming a first mask layer for gluing the metal layer and a second mask layer to be formed over the metal layer; forming the second mask layer over the first mask layer; and forming first and second mask patterns by selectively etching the first and the second mask layers. In some implementations, the first mask layer includes nitride. In some implementations, the first mask layer has a non-stoichiometric composition. In some implementations, the first mask layer has a smaller thickness than the second mask layer. In some implementations, the forming of the first mask layer is performed at a temperature of 300° C. or less. In some implementations, the first and the second mask patterns define a hole in which the mask pattern is to be formed. In some implementations, the method further includes: forming a material layer for forming the mask pattern within the hole after forming the first and the second mask patterns; and removing the first and the second mask patterns. In some implementations, the first and the second mask patterns cover a region where the variable resistance region is to be formed.

These and other aspects, implementations and associated advantages are described in greater detail in the drawings, the description and the claims.

DETAILED DESCRIPTION

Figure 1:
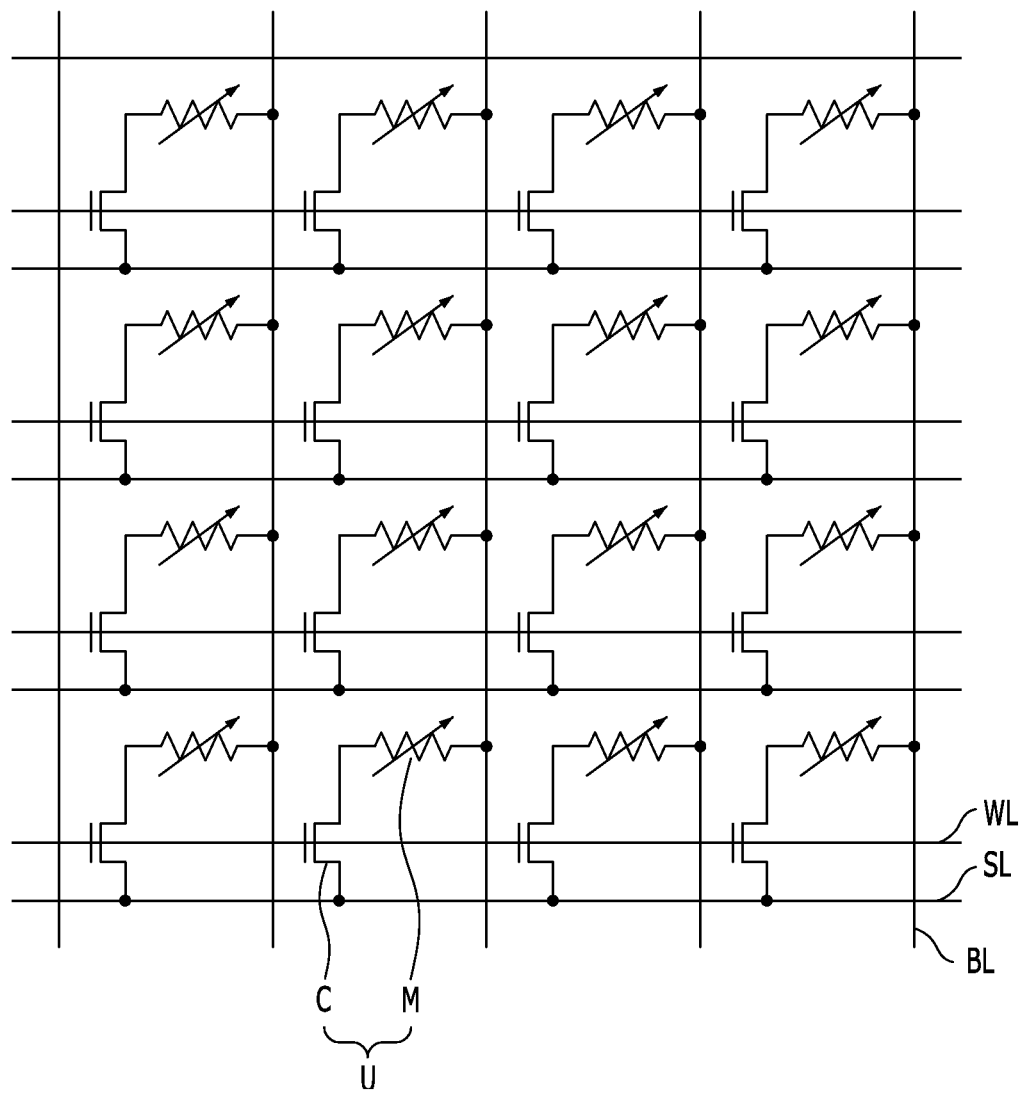
FIG. 1 is a diagram schematically showing a semiconductor device in accordance with one implementation of the disclosed technology in this document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a diagram schematically showing a semiconductor device in accordance with one implementation of the disclosed technology in this document.

Referring to FIG. 1, the semiconductor device includes a memory array in which a plurality of memory cells U is arranged in a matrix form. Each of the memory cells U includes a memory unit M for storing data and an access unit C for selecting the memory unit M in storing data or reading data from the selected memory unit M.

The memory unit M in each memory cell U includes two electrodes and a variable resistance element interposed between the two electrodes. The memory unit M stores data using a characteristic in which a resistance value of the variable resistance element is varied in response to a current or voltage supplied to the variable resistance element through the two electrodes. One end of the memory unit M may be electrically coupled with a bit line BL, and the other end of the memory unit M may be electrically coupled with one end of the access unit C. In addition to the bit lines BL, conductive lines, Word Lines WL and Source Lines SL, are provided in the semiconductor device in FIG. 1 for linking the memory cells in the matrix form.

The access unit C in each memory cell may be a transistor. The transistor may have a drain coupled with a corresponding memory unit M, a source coupled with a corresponding source line SL, and a gate coupled with a corresponding word line WL. However, other implementations are possible. The access unit C may include various elements, for example, a diode.

Figure 2:
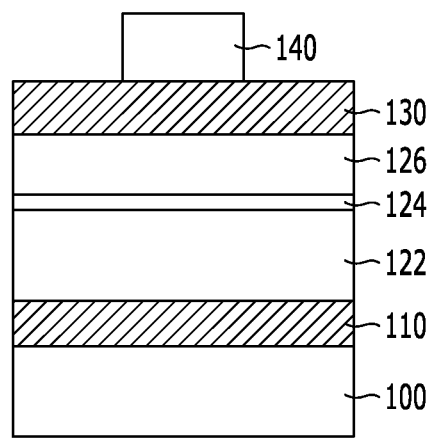
FIGS. 2 to 5 are diagrams for explaining an example of a method of fabricating a semiconductor device in accordance with implementations of the disclosed technology in this document.
Figure 3:
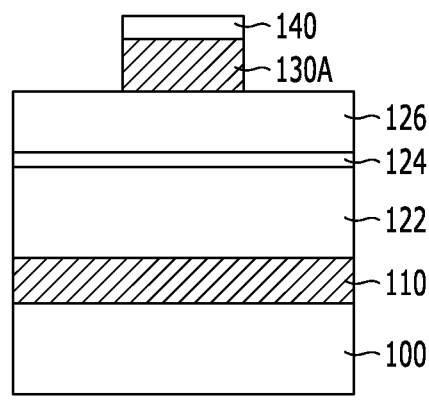
Figure 4:
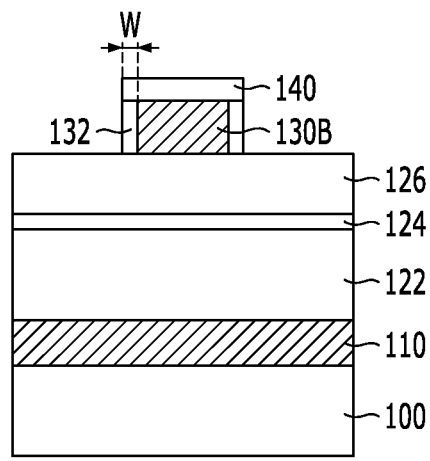
Figure 5:
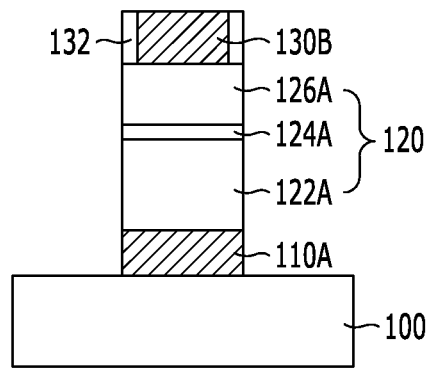

FIGS. 2 to 4 are diagrams for explaining processes for fabricating the semiconductor device. FIG. 5 shows the semiconductor device that is fabricated by using the processes described in FIGS. 2 to 4. Furthermore, the present implementation shows an example in which a magnetic resistance element having a magnetoresistance change ratio according to a magnetoresistance effect, such as a magnetic tunnel junction (MTJ), is used as a variable resistance element. Such a variable resistance element may be interposed between a lower electrode and an upper electrode and be supplied with a current or voltage.

Referring to FIG. 2, a substrate 100 is provided to include a specific structure, such as the access unit C of FIG. 1.

A conductive layer 110 is formed on the substrate 100 to provide a lower electrode for a variable resistance element. The conductive layer 110 may be a single layer or a multiple layer which includes metal, such as Pt, Ir, Ru, Al, Cu, W, Ti, or Ta, or metal nitride, such as TiN, TaN, WN, or MoN. The conductive layer 110 may include materials other than a metal or a metal nitride. Various types of conductive materials may be used as the conductive layer 110.

Material layers are formed over the conductive layer 110 as the lower electrode to form a magnetic resistance element. For example, a lower magnetic layer 122, a tunnel barrier layer 124, and an upper magnetic layer 126 are sequentially formed over the conductive layer 110 to construct the magnetic resistance element.

One of the lower magnetic layer 122 and the upper magnetic layer 126 may be a pinned layer having a pinned magnetization direction, and the other thereof may be a free layer having a variable magnetization direction. Each of the lower magnetic layer 122 and the upper magnetic layer 126 may be a single layer or a multiple layer which includes ferromagnetic materials, for example, an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, but other implementations for the lower magnetic layer 122 and the upper magnetic layer 126 are also possible.

The tunnel barrier layer 124 may change the magnetization direction of the lower magnetic layer 122 or the upper magnetic layer 126 by the tunneling of electrons. The tunnel barrier layer 124 may be a single layer or a multiple layer which includes oxide, for example, MgO, CaO, SrO, TiO, VO, or NbO. Tunnel barrier layer 124 may include various materials other than the oxide.

The magnetic resistance element shown in the example in FIG. 2 includes the tunnel barrier layer 124 interposed between the two magnetic layers 122 and 126. In implementations, the magnetic resistance element may include additional layers. For example, although not shown, a single layer or a multiple layer may be formed over a pinned layer, for example, a lower magnetic layer 122 or the upper magnetic layer 126, to pin the magnetization direction of a pinned layer. In this case, the additional layers may include anti-ferromagnetic materials, for example, FeMN, NiMn, PtMn, PdMn, PtPdMn, RuMn, OsMn, IrMn, or CrPtMn.

In the specific example in FIG. 2, a metal layer 130 is formed on the upper magnetic layer 126. The metal layer 130 may function as the upper electrode of the magnetic resistance element and can be configured to be easily oxidized. The metal layer 130 may include, for example, a refractory metal, such as tantalum (Ta), titanium (Ti), or tungsten (W). The metal layer 130 can be easily oxidized in a subsequent oxidization process (refer to FIG. 4).

A mask pattern 140 is formed on the metal layer 130 to cover a region in which a magnetic resistance element will be formed. The mask pattern 140 may have an island shape and may be a single layer or a multiple layer including various types of materials, such as insulating materials, semiconductor materials, organic materials, and conductive materials. A method of forming such a mask pattern 140 will be described in detail later with reference to FIGS. 7A to 7D.

Referring to FIG. 3, a metal layer pattern 130A is formed by etching the metal layer 130 in FIG. 2 by using the mask pattern 140 as an etch barrier. Since a part of the mask pattern 140 is lost through etching, the mask pattern 140 may have a reduced thickness after the etching process. In other implementations, the mask pattern 140 may be fully removed after the etching process.

Referring to FIG. 4, an exposed part of the metal layer pattern 130A is subject to a surface treatment in a gaseous environment or atmosphere including oxygen. As illustrated in the specific example of FIG. 4, a side part having a width W of the metal layer pattern 130A is exposed and oxidized, e.g., uniformly oxidized. As a result of oxidization, a metal oxide layer 132 is formed. The surface treatment for forming the oxidation layer 132 may be performed using a plasma treatment or thermal treatment method.

Figure 6:
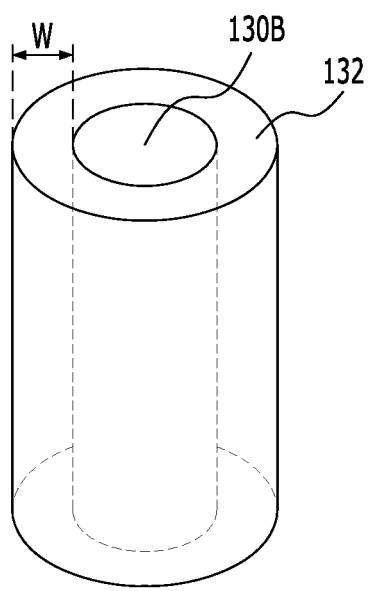
FIG. 6 is an enlarged perspective view of a metal oxide layer and an upper electrode shown in FIG. 5.

As a result of the above process, a metal layer pattern 130B remains and has a smaller width than the metal layer pattern 130A before the oxidation surface treatment. The metal oxide layer 132 is formed to surround the metal layer pattern 130B (refer to FIGS. 4 and 6). The metal layer pattern 130B having the reduced width is formed of a metal part that has not been oxidized and functions as an upper electrode for the magnetic resistance element. The metal oxide layer 132 is known to exhibit a low etch rate and thus can function as a hard mask in a process of etching the material layers 122, 124, and 126 in forming a magnetic resistance element. The width W of the metal oxide layer 132 can be controlled to a desired width by controlling various conditions, for example, temperature, time, and a flow rate of the gas in the plasma treatment or thermal treatment processes.

Referring to FIG. 5, a magnetic resistance element 120 is formed to have a stack structure including a lower magnetic layer pattern 122A, a tunnel barrier layer pattern 124A, and an upper magnetic layer pattern 126A. In order to form the magnetic resistance element 120, the upper magnetic layer 126, the tunnel barrier layer 124, and the lower magnetic layer 122 are etched using the metal oxide layer 132 and the upper electrode 130B as an etch barrier. In a process of performing such an etching process, the mask pattern 140 may be fully removed or may partially remain. If the remaining mask pattern 140 includes one or more conductive materials, the remaining mask pattern 140, together with the upper electrode 130B, may function as the upper electrode.

The etching process for forming the magnetic resistance element 120 may be performed using etching techniques such as a sputtering etching or an ion beam etching (IBE) exhibiting a strong physical etching characteristic.

When performing a sputtering etching, since the metal oxide layer 132 has a low etch rate, the metal oxide layer 132 on the sidewall of the upper electrode 130B is rarely lost. The same happens when performing the IBE method where ions that are inclined and incident do not impact the side of the metal oxide layer 132. This is because metal oxides have a lower sputtering yield than corresponding metals. Accordingly, the shape of the metal oxide layer 132 does not change in the etching process for forming the magnetic resistance element 120. In particular, the side part of the metal oxide layer 132 is rarely changed, and thus the metal oxide layer 132 can function as a hard mask. By using the metal oxide layer 132 as a hard mask, the magnetic resistance element 120 can be formed to have a desired shape.

A lower electrode 110A is formed by etching the conductive layer 110 which has been exposed by the magnetic resistance element 120. The lower electrode 110A may be patterned to be connected to one end of an access unit (not shown) formed in the substrate 100.

Although not shown, an upper electrode contact may be formed on the upper electrode 130B, and a process of forming a bit line on the upper electrode contact may be performed.

Upon completing the aforementioned processes, a semiconductor device of FIG. 5 is formed.

As shown in FIG. 5, the semiconductor device includes a stack structure including the lower electrode 110A, the magnetic resistance element 120, and the upper electrode 130B and the metal oxide layer 132 surrounding the side part of the upper electrode 130B.

The upper electrode 130B includes a metal, and the metal oxide layer 132 includes an oxide of the same metal as that of the upper electrode 130B. Furthermore, the side surface of the metal oxide layer 132 and the side surface of the magnetic resistance element 120 underneath the upper electrode 130B and the metal oxide layer 132 are aligned along a straight line. This is because the magnetic resistance element 120 is formed using the metal oxide layer 132 as an etch barrier or a hard mask in subsequent etching in the aforementioned process.

The magnetic resistance element 120 may include the lower magnetic layer pattern 122A, the tunnel barrier layer pattern 124A, and the upper magnetic layer pattern 126A which are sequentially stacked.

In such a semiconductor device, data can be stored using a characteristic in which a resistance value of the magnetic resistance element 120 is varied depending on the magnetization directions of the lower magnetic layer pattern 122A and the upper magnetic layer pattern 126A. For example, the lower magnetic layer pattern 122A and the upper magnetic layer pattern 126A may have parallel magnetization directions or anti-parallel magnetization directions in response to an electric current supplied through the lower electrode 110A and the upper electrode 130B. If the lower magnetic layer pattern 122A and the upper magnetic layer pattern 126A have parallel magnetization directions, the magnetic resistance element 120 can store data '0' because it has a low resistance state. In contrast, if the lower magnetic layer pattern 122A and the upper magnetic layer pattern 126A have anti-parallel magnetization directions, the magnetic resistance element 120 can store data '1' because it has a high resistance state.

The semiconductor device and the fabrication method in accordance with the aforementioned implementations may be modified in various ways.

For example, in the aforementioned implementation, after the magnetic resistance element 120 is patterned, the conductive layer 110 is patterned to form a lower electrode. In other implementations, the conductive layer 110 may be patterned to form a lower electrode prior to depositing the material layers 122, 124, and 126 for forming the magnetic resistance element 120.

Further, in the aforementioned implementation related to FIG. 4, the metal oxide layer 132 is formed by performing an oxidation process via the surface treatment in an atmosphere including oxygen or other oxidation processes. As described above, the oxide layer 132 exhibits a low etch rate and thus is used as an etch barrier or hard mask in subsequent etching of the material layers 122, 124, and 126 in forming a well-defined magnetic resistance element. In other implementations, the oxide layer 132 of a low etch rate can be replaced by other layers of low etch rates to function as the etch barrier or hard mask under a strong physical etching condition. For example, the oxide layer 132 of a low etch rate can be replaced by a nitride layer of a low etch rate to function as a suitable etch barrier or hard mask. Accordingly, the surface treatment, such as plasma treatment or thermal treatment, may be performed in a gaseous environment or atmosphere including nitrogen instead of oxygen so that a metal nitride layer instead of the metal oxide layer 132 is formed to surround the side of the upper electrode 130B as an etch barrier or hard mask under a strong physical etching condition. Furthermore, another suitable element, in addition to the aforementioned oxygen or nitrogen, that can form a compound with the metal in the layer 130 which can satisfy a low etch rate even in a condition that includes a strong physical etching characteristic can be used in the surface treatment to form such a metal compound layer that surrounds the sidewall of the upper electrode 130B. Such a metal compound layer may be formed by performing surface treatment, such as plasma treatment or thermal treatment, in an atmosphere including the corresponding suitable element used for forming the desired metal compound layer as the etch barrier or hard mask.

In the aforementioned implementations, a variable resistance element is formed as the magnetic resistance element 120 including magnetic materials. However, other implementations are possible. For example, if the variable resistance element may be used in RRAM, the variable resistance element may include transition metal oxide or metal oxide such as perovskite-based materials. In such a case, the variable resistance element may have a characteristic switched between different resistance states due to the generation and distinction of a current filament that are attributable to the behavior of vacancy. In another implementation, if the variable resistance element may be used in PRAM, the variable resistance element may include phase change materials, such as chalcogenide-based materials. In such a case, when the phase change materials is stabilized to any one of a crystalline state and an amorphous state due to heat, the variable resistance element may have a characteristic switched between different resistance states. Although the variable resistance element is usually interposed between the upper electrode and the lower electrode, other implementations are also possible.

A variable resistance element can be easily patterned using a method having a strong physical etching characteristic, and damage to sidewalls of a hard mask used when patterning the variable resistance element can be prevented by forming sidewalls of the hard mask using a metal compound with a desired low etch rate such as metal oxides or nitrides. Accordingly, a desired shape of a variable resistance element can be obtained and thus the reliability and yield of a device can be improved. Furthermore, the damage to the sidewall of a hard mask can be prevented using a simple process, and a metal that remains inside can also be used as an upper electrode.

As discussed above, in order to obtain a desired shape of a variable resistance element, the metal layer pattern 130A needs to have an excellent shape. A method of forming the mask pattern 140 for securing a metal layer pattern having an desired shape is described below with reference to FIGS. 7A to 7D.

FIGS. 7A to 7D are cross-sectional views illustrating an example of a method of forming the mask pattern 140 of FIG. 2.

Figure 7A:
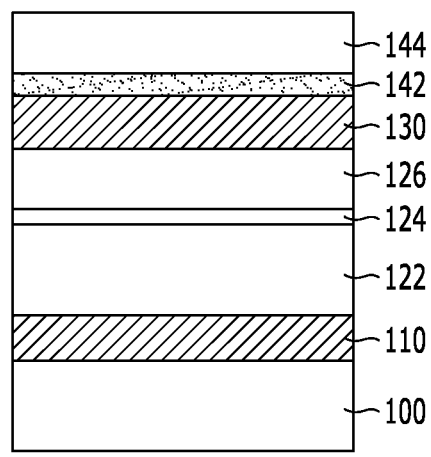
FIGS. 7A to 7D are cross-sectional views illustrating an example of a method of forming a mask pattern 140 of FIG. 2.

Referring to FIG. 7A, there is provided a structure in which the conductive layer 110 for a lower electrode, the lower magnetic layer 122, the tunnel barrier layer 124, the upper magnetic layer 126, and the metal layer 130 are stacked over the substrate 100.

A first mask layer 142 is formed on the stack structure. The first mask layer 142 functions to prevent the lifting of a second mask layer 144 to be formed in a subsequent process. The first mask layer 142 may include nitride having an excellent adhesive force with the metal layer 130 and the second mask layer 144. For example, the first mask layer 142 may include silicon nitride. Nitride has a greater adhesive force with the metal layer 130 than oxide. Further, nitride has a greater adhesive force with materials such as oxide, silicon, and amorphous carbon, which mainly used for a mask in a semiconductor mass-production process. Furthermore, the first mask layer 142 may include nitride having a non-stoichiometric composition. In such a case, the adhesive force can be further enhanced.

The first mask layer 142 may be formed in a low temperature, e.g., 300° C. or less. In a low-temperature process, if silicon nitride is used to form the first mask layer 142, a silicon component or a nitrogen component may be combined with the underlying metal layer 130. Thus, it is possible to prevent the metal layer 130 from being deformed. Furthermore, the non-stoichiometric composition of the first mask layer 142 can be easily implemented.

Next, the second mask layer 144 is formed on the first mask layer 142. The second mask layer 144 may be a single layer or a multiple layer including various types of materials, such as insulating materials, semiconductor materials, organic materials, and conductive materials. For example, the second mask layer 144 may be a stack layer including an oxide layer, a carbon-containing layer (e.g., an amorphous carbon layer), and an oxide nitride layer. The thickness of the second mask layer 144 may be greater than that of the first mask layer 142.

Figure 7B:
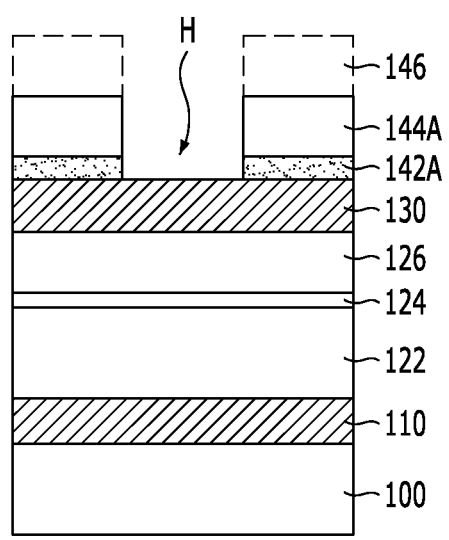

Referring to FIG. 7B, a photoresist pattern 146 having an opening is formed on the second mask layer 144. The opening exposes a region where a magnetic resistance element will be formed. The second mask layer 144 and the first mask layer 142 are etched using the photoresist pattern 146 as an etch barrier. The etched second mask layer 144 and the etched first mask layer 142 are referred to as a second mask pattern 144A and a first mask pattern 142A. A hole H is formed by the first and the second mask patterns 142A and 144A to define the region where a magnetic resistance element will be formed.

Although the first mask pattern 142A and the second mask pattern 144A are formed of different materials, there is no bad influence on a sidewall profile when performing the etching process for forming the first mask pattern 142A and the second mask pattern 144A. Since the first mask pattern 142A having a smaller thickness than the second mask pattern 144A includes a non-stoichiometric composition, physical properties (e.g., hardness) are weak as compared when the first mask pattern 142A has a stoichiometric composition, and thus, etching can be facilitated. Accordingly, the hole H can have a sidewall profile that is substantially vertical.

The photoresist pattern 146 may be fully lost in the etching process for forming the first mask pattern 142A and the second mask pattern 144A or may be removed by an additional process after forming the first mask pattern 142A and the second mask pattern 144A.

Figure 7C:
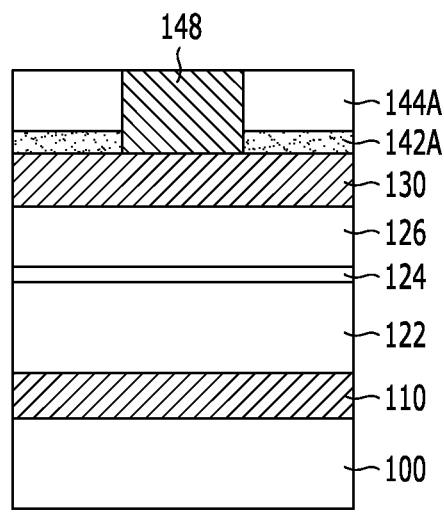

Referring to FIG. 7C, a third mask pattern 148 is formed in the hole H defined by the first and the second mask patterns 142A and 144A by filling the hole H with materials.

The third mask pattern 148 may have an island shape that covers a region where a magnetic resistance element will be formed.

The third mask pattern 148 may have a single layer or a multiple layer including various types of materials, such as insulating materials, semiconductor materials, organic materials, and conductive materials. For example, the third mask pattern 148 may include the same metal materials as the metal layer 130. In another implementation, the third mask pattern 148 may have a dual layer including a barrier metal layer formed along the sidewall and bottom of the hole H and a metal layer buried in the remaining spaces of the hole H in which the barrier metal layer is formed.

The third mask pattern 148 can be performed by forming a material layer on the resultant structure of FIG. 7B and then performing a polishing process, for example, a chemical mechanical polishing (CMP) process until the second mask pattern 144A is exposed. For example, if the third mask pattern 148 has a dual layer including a barrier metal layer and a metal layer, the third mask pattern 148 may be formed by forming the barrier metal layer on the resultant structure of FIG. 7B, forming the metal layer having a thickness to sufficiently fill the hole H on the barrier metal layer, and then performing a polishing process until the second mask pattern 144A is exposed.

Figure 7D:
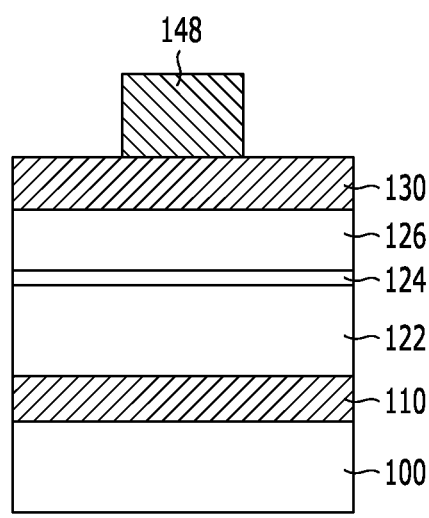

Referring to FIG. 7D, the first and the second mask patterns 142A and 144A are removed from the resultant structure of FIG. 7C. Such a removal process may be performed using a wet etching method for the second mask pattern 144A. If the first mask pattern 142A has a smaller thickness and includes a non-stoichiometric composition having weak physical properties, the first mask pattern 142A may also be removed when removing the second mask pattern 144A. In such a case, since an additional process for removing the first mask pattern 142A is not necessary, there is an advantage of simplifying a process.

Upon completing above processes, a structure similar to that of FIG. 2 is obtained. The third mask pattern 148 of FIG. 7D may correspond to the mask pattern 140 of FIG. 2.

In accordance with the aforementioned process, the lifting of the second mask pattern 144A can be prevented through a simple process, and thus the third mask pattern 148 having an excellent sidewall profile can be secured. As a result, a magnetic resistance element having a desired shape can be obtained in a subsequent process (refer to FIGS. 3 to 5). In the implementation of FIGS. 7A to 7D, the first and the second mask patterns 142A and 144A are formed to expose the hole H corresponding to a region where a magnetic resistance element will be formed. However, other implementations are possible. For example, the first and the second mask patterns 142A and 144A may have an island shape that covers a region where a magnetic resistance element will be formed. In such a case, the first and the second mask patterns 142A and 144A correspond to the mask pattern 140 of the aforementioned implementation, and a process for forming the third mask pattern 148 can be omitted.

The above and other memory circuits or semiconductor devices based on the disclosed technology can be used in a range of devices or systems. FIGS. 8-12 provide some examples of devices or systems that can implement the memory circuits disclosed herein.

Figure 8:
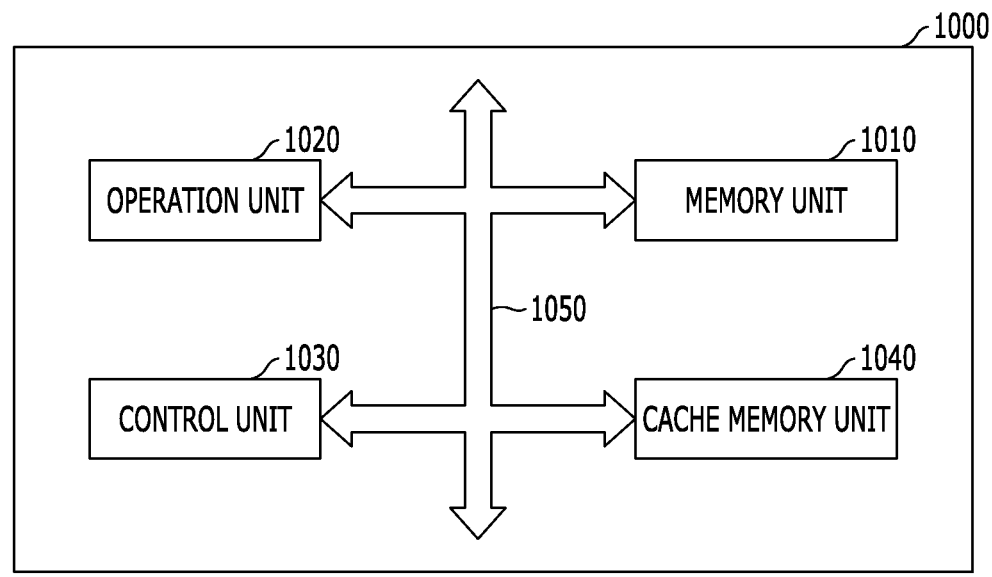
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
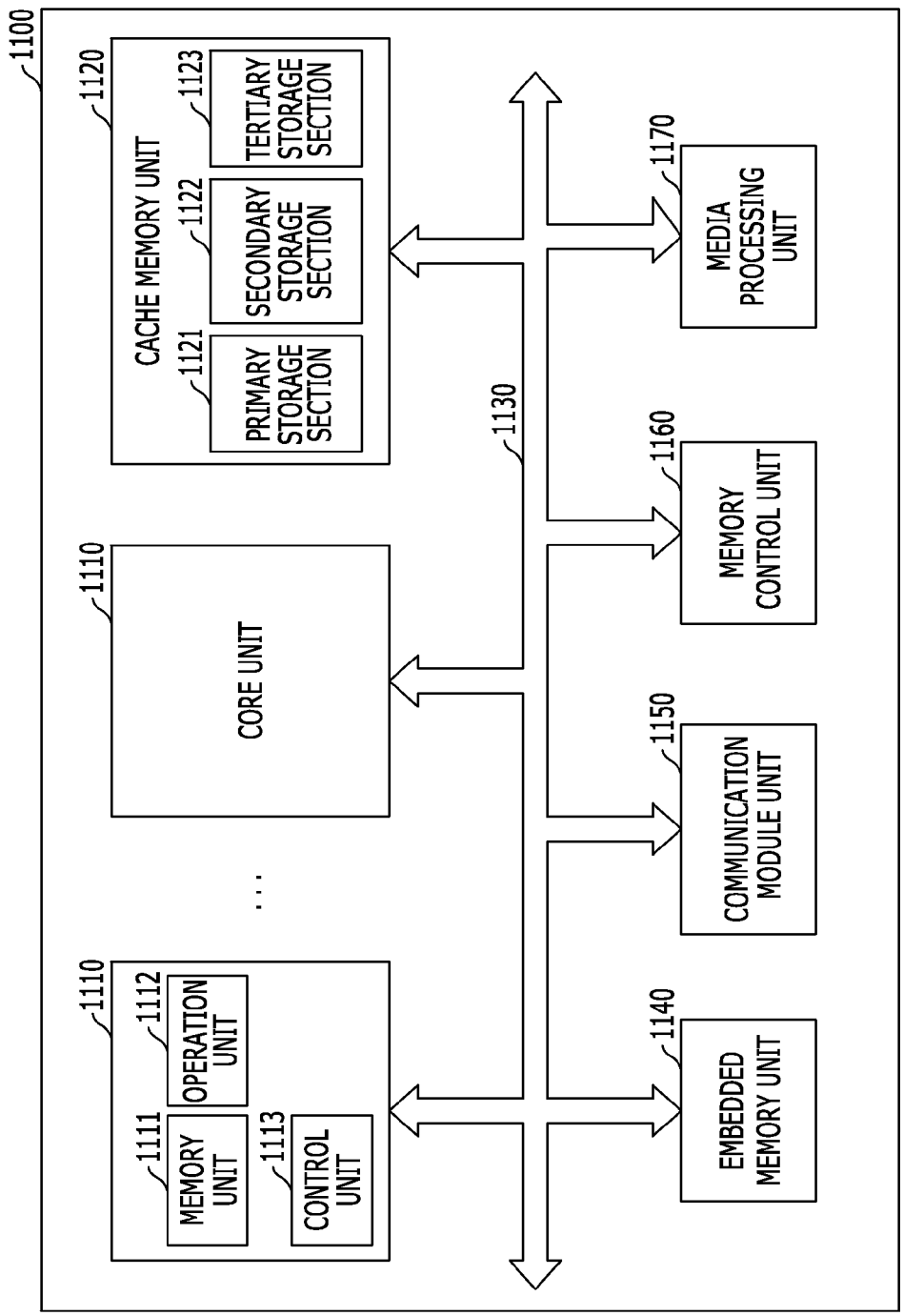
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
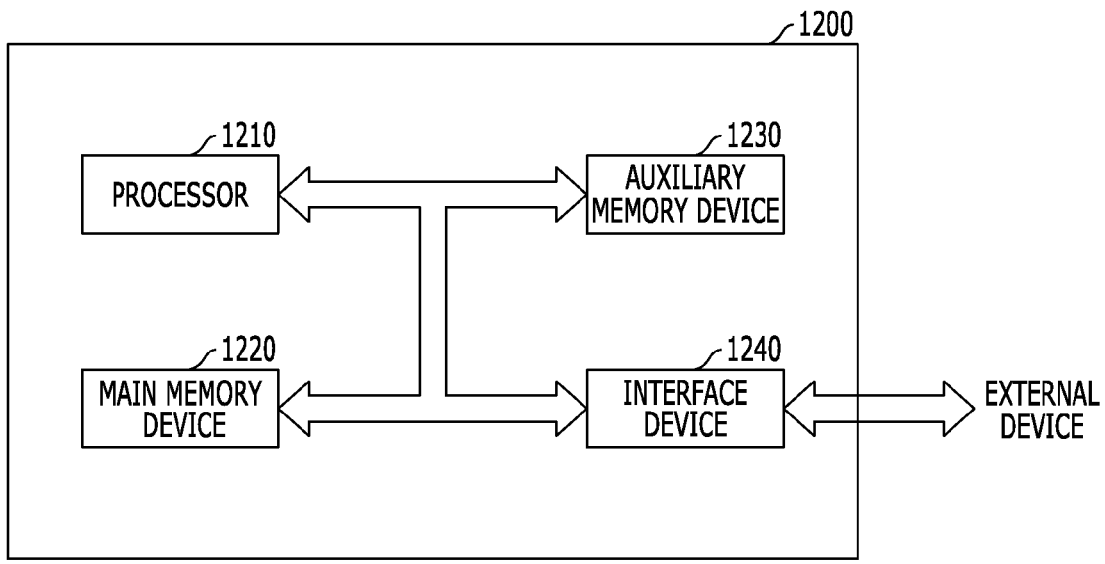
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the main memory device 1220 may become easier and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
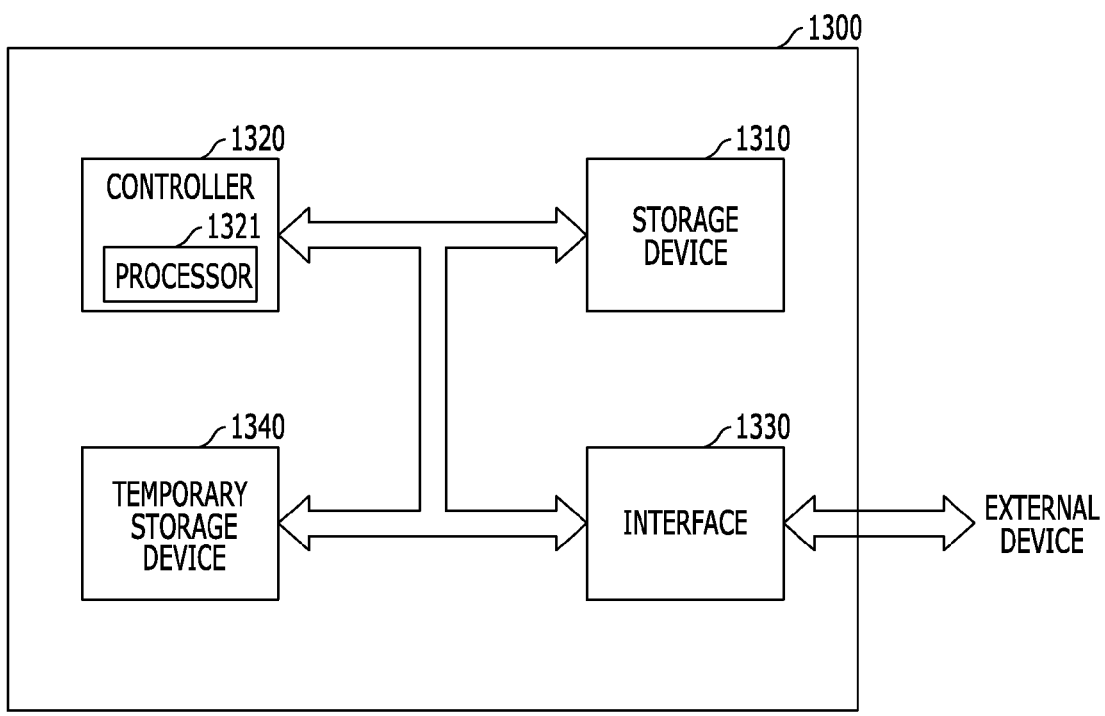
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 12:
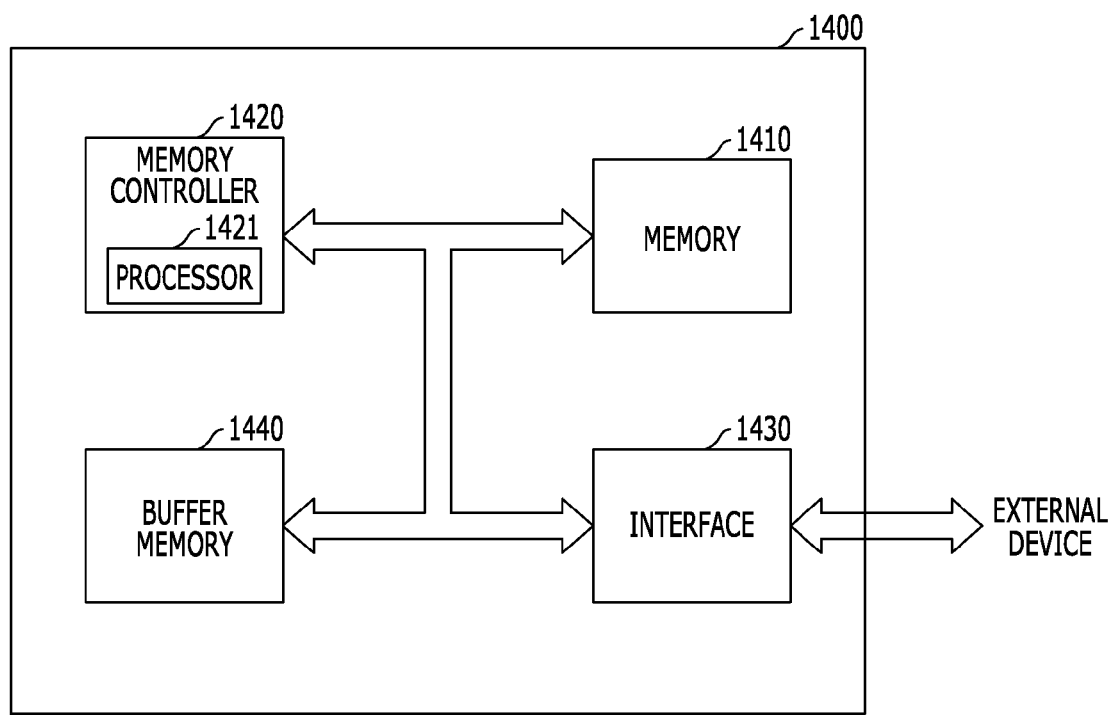
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a lower electrode; a variable resistance element over the lower electrode; an upper electrode disposed over the variable resistance element and including metal; and a metal compound layer configured to surround a side of the upper electrode, wherein the metal compound layer comprises a compound of the metal of the upper electrode. Through this, a fabrication process of the buffer memory 1440 may become easier and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method of manufacturing an electronic device comprising semiconductor memory, comprising:
    forming a material layer for forming a variable resistance element over a substrate;
    forming a metal layer over the material layer;
    forming a mask pattern over the metal layer;
    forming a metal layer pattern by etching the metal layer using the mask pattern as an etch barrier;
    performing a surface treatment on the metal layer pattern so that an external part of the metal layer pattern is transformed into a metal compound layer having a low etch rate as an etch barrier; and
    etching the material layer using the metal layer pattern and the metal compound layer as an etch barrier to form a variable resistance element having an external side aligned with an external side of the metal compound layer.

2. The method of claim 1, wherein the forming of the material layer includes forming a sequentially stack structure including a first magnetic layer, a tunnel barrier layer, and a second magnetic layer.

3. The method of claim 1, wherein the forming of the material layer comprises forming a metal oxide layer.

4. The method of claim 1, wherein the forming of the material layer comprises forming a phase change material layer.

5. The method of claim 1, wherein the surface treatment is performed using plasma treatment or thermal treatment.

6. The method of claim 1, wherein:
the surface treatment is performed to cause oxidation of the metal layer, and
the metal compound layer includes a metal oxide layer.

7. The method of claim 1, wherein:
the surface treatment is performed in an atmosphere including nitrogen, and
the metal compound layer includes a metal nitride layer.

8. The method of claim 1, wherein the forming of the variable resistance element is performed using a sputtering etching method.

9. The method of claim 8, wherein the forming of the variable resistance element is performed using an ion beam etching method.

10. The method of claim 8, wherein,
the surface treatment is performed in an atmosphere including oxygen, and
the metal compound layer includes a metal oxide layer.

11. The method of claim 1, wherein the forming of the mask pattern comprises:
forming a first mask layer for gluing the metal layer and a second mask layer to be formed over the metal layer;
forming the second mask layer over the first mask layer; and
forming first and second mask patterns by selectively etching the first and the second mask layers.

12. The method of claim 11, wherein the first mask layer comprises nitride.

13. The method of claim 11, wherein the first mask layer has a non-stoichiometric composition.

14. The method of claim 11, wherein the first mask layer has a smaller thickness than the second mask layer.

15. The method of claim 11, wherein:
the first and the second mask patterns define a hole in which the mask pattern is to be formed.

16. The method of claim 11, wherein the first and the second mask patterns cover a region where the variable resistance region is to be formed.

17. The method of claim 1, wherein the metal compound layer vertically overlaps with the variable resistance element.

18. The method of claim 1, wherein the metal layer pattern has a pillar shape, and the metal compound pattern has a cylindrical ring shape surrounding the metal layer pattern.

19. The method of claim 1, wherein the metal compound layer completely surrounds a side of the metal layer pattern.

20. A method of manufacturing an electronic device comprising semiconductor memory, comprising:
forming a material layer for forming a variable resistance element over a substrate;
forming a metal layer over the material layer;
forming a mask pattern over the metal layer;
forming a preliminary metal layer pattern by etching the metal layer using the mask pattern as an etch barrier;
performing a surface treatment process to transform an external part of the preliminary metal layer pattern into a metal compound layer, wherein the preliminary metal layer pattern is formed to a metal layer pattern, wherein a width of the metal layer pattern is less than a width of the preliminary metal layer pattern; and
etching the material layer using the metal layer pattern and the metal compound layer as an etch barrier to form a variable resistance element having an external side aligned with an external side of the metal compound layer.

21. The method of claim 20, wherein the metal compound layer is vertically overlapped with the variable resistance element.

22. The method of claim 20, wherein the metal layer pattern has a pillar shape, and the metal compound pattern has a cylindrical ring shape.

23. The method of claim 20, wherein the metal compound layer completely surrounds a side of the metal layer pattern.

* * * * *